(12) United States Patent
Miki

(10) Patent No.: US 8,868,146 B2
(45) Date of Patent: Oct. 21, 2014

(54) RE-CONDENSATION DEVICE AND NMR ANALYSIS DEVICE PROVIDED THEREWITH

(75) Inventor: Takashi Miki, Kobe (JP)

(73) Assignee: Kobe Steel Ltd., Hyogo (JP)

( * ) Notice: Subject to any disclaimer, the term of this patent is extended or adjusted under 35 U.S.C. 154(b) by 130 days.

(21) Appl. No.: 13/704,551

(22) PCT Filed: Mar. 25, 2011

(86) PCT No.: PCT/JP2011/001778
§ 371 (c)(1),
(2), (4) Date: Dec. 14, 2012

(87) PCT Pub. No.: WO2011/158411
PCT Pub. Date: Dec. 22, 2011

(65) Prior Publication Data
US 2013/0123110 A1    May 16, 2013

(30) Foreign Application Priority Data
Jun. 16, 2010  (JP) ................. 2010-136897

(51) Int. Cl.
| G01R 33/035 | (2006.01) |
| F25D 19/00 | (2006.01) |
| F17C 5/04 | (2006.01) |
| G01R 33/383 | (2006.01) |

(52) U.S. Cl.
CPC . *F17C 5/04* (2013.01); *F25D 19/00* (2013.01); *G01R 33/383* (2013.01); *F25B 2400/17* (2013.01)
USPC .......................................... 505/162

(58) Field of Classification Search
CPC .......... G01R 33/0358; G01R 33/0352; H01L 39/225
See application file for complete search history.

(56) References Cited

FOREIGN PATENT DOCUMENTS

| JP | 2006-046896 A | 2/2006 |
| JP | 2007-051850 A | 3/2007 |
| JP | 2007-278550 A | 10/2007 |

OTHER PUBLICATIONS

International Search Report issued from the International Bureau in the corresponding International Application No. PCT/JP2011/001778, mailed Jun. 28, 2011, 2 pages.

*Primary Examiner* — Colleen Dunn
(74) *Attorney, Agent, or Firm* — Morris, Manning & Martin, LLP; Tim Tingkang Xia, Esq.

(57) ABSTRACT

A re-condensation device allows an NMR analysis device to be reduced in overall size and minimizes heat penetration into a liquid helium tank. An NMR analysis device provided with said re-condensation device. The re-condensation device includes: a second cooling member, part of which is inserted into a neck tube, and which re-condenses liquid helium; and a first cooling member, part of which is inserted into the neck tube. The second cooling member is thermally connected to a chiller's second cooling stage, and the first cooling member is thermally connected to the chiller's first cooling stage. The first cooling member has: a first insertion part, which has a diameter that allows insertion into the neck tube; and an inside contact part on the outer surface of the first insertion part and that cools heat seals by contacting, from the inside, a part of the neck tube that outside contact parts contact.

12 Claims, 8 Drawing Sheets

FIG. 6

| NECK TUBE CONTACT | TEMPERATURE OF PORTION IN CONTACT WITH 8a | TEMPERATURE T1 | TEMPERATURE T2 | HEAT CONDUCTION Q1 | RADIANT HEAT TRANSFER Q2 |
|---|---|---|---|---|---|
| CONTACT | LOW | LOW | APPROX. 4.2 K | SMALL | SMALL |
| NO CONTACT | HIGH | HIGH | APPROX. 4.2 K | LARGE | LARGE |

RE-CONDENSATION DEVICE AND NMR ANALYSIS DEVICE PROVIDED THEREWITH

TECHNICAL FIELD

The present invention relates to an NMR analysis device equipped with a liquid helium tank that contains a superconducting magnet and liquid helium that cools the superconducting magnet and a re-condensation device that is provided in the liquid helium tank and re-condenses the liquid helium.

BACKGROUND ART

Presently, NMR analysis devices, which analyze a specimen using a static magnetic field produced by a superconducting magnet, are known.

For example, Patent Literature 1 discloses an analysis device that includes a superconducting magnet, a liquid helium tank that contains a superconducting magnet and liquid helium that cools the superconducting magnet, a liquid nitrogen tank that surrounds the liquid helium tank and contains liquid nitrogen, a vacuum container that covers the liquid helium tank and the liquid nitrogen tank, and a two-stage chiller that is attached so as to communicate with the liquid helium tank and the liquid nitrogen tank.

In the analysis device disclosed in Patent Literature 1, penetration of external heat into the liquid helium tank is suppressed by the cold of liquid nitrogen contained in the liquid nitrogen tank. Also in the analysis device disclosed in Patent Literature 1, liquid helium is re-condensed using a low-temperature side stage of the two-stage chiller, and liquid nitrogen is re-condensed using a high-temperature side stage of the two-stage chiller.

Specifically, a liquid helium re-condensation tank is provided for the low-temperature side stage of the two-stage chiller. A helium gas from the liquid helium tank is received in the liquid helium re-condensation tank. A liquid nitrogen re-condensation tank is provided for the high-temperature side stage of the two-stage chiller using a heat transfer rod. A nitrogen gas from the liquid nitrogen tank is received in the liquid nitrogen re-condensation tank.

However, in order to cool the superconducting magnet, the analysis device disclosed in Patent Literature 1 needs to include not only the liquid helium tank but also the liquid nitrogen tank. Thus, it is difficult to reduce the overall size of the analysis device.

The liquid nitrogen tank may be omitted from the analysis device. In this case, however, there arises a problem on how to suppress penetration of external heat into the liquid helium tank.

CITATION LIST

Patent Literature

PTL 1: Japanese Unexamined Patent Application Publication No. 2007-51850

SUMMARY OF INVENTION

An object of the present invention is to provide a re-condensation device that allows an NMR analysis device to be reduced in overall size and heat penetration into a liquid helium tank to be suppressed. The present invention also provides an NMR analysis device provided with the re-condensation device.

In order to solve the above-described problem, the present invention provides a re-condensation device provided in a magnetic field producing unit that includes a liquid helium tank that contains a superconducting magnet and liquid helium that cools the superconducting magnet, a neck tube that protrudes upward from the liquid helium tank, and at least one covering member that covers the liquid helium tank from an outside of the liquid helium tank and that has an outside contact part that is in thermal contact with the neck tube from an outside of the neck tube. The re-condensation device re-condenses the liquid helium and includes a chiller that includes a first cooling stage and a second cooling stage, the temperature of which is decreased to a temperature lower than a temperature of the first cooling stage, and a second cooling member thermally connected to the second cooling stage. At least a portion of the second cooling member is inserted into the neck tube so as to re-condense the liquid helium. The re-condensation device also includes a first cooling member that is thermally connected to the first cooling stage. At least a portion of the first cooling member is inserted into the neck tube. In the re-condensation device, the first cooling member has a first insertion part having a diameter, with which the first insertion part is able to be inserted into the neck tube, and an inside contact part provided on an outer side surface of the first insertion part so as to cool the covering member through contact with a portion of the neck tube from an inside of the neck tube.

The present invention also provides an NMR analysis device that analyzes a specimen utilizing a static magnetic field produced by a superconducting magnet and includes a liquid helium tank that contains the superconducting magnet and liquid helium that cools the superconducting magnet, a neck tube that protrudes upward from the liquid helium tank, at least one covering member that covers the liquid helium tank from an outside of the liquid helium tank and that has an outside contact part that is in thermal contact with the neck tube from an outside of the neck tube, and the above-described re-condensation device that is provided in the neck tube and re-condenses the liquid helium. In the NMR analysis device, the first cooling member of the re-condensation device has the first insertion part having the diameter, with which the first insertion part is able to be inserted into the neck tube, and the inside contact part provided on the outer side surface of the first insertion part so as to cool the covering member through contact with a portion of the neck tube from an inside of the neck tube.

According to the present invention, the size of the entire NMR analysis device can be reduced and penetration of heat into the liquid helium tank can be suppressed.

BRIEF DESCRIPTION OF DRAWINGS

FIG. 6 is a table that shows temperatures of portions of the NMR analysis device of the present embodiment having an inside contact part and temperatures of portions of an NMR analysis device of a comparative example without an inside contact part.

DESCRIPTION OF EMBODIMENTS

An embodiment of the present invention will be described below with reference to the accompanying drawings. It should be understood that the following embodiment is an example of an embodiment of the present invention and not intended to limit the technical scope of the present invention.

Figure 1:
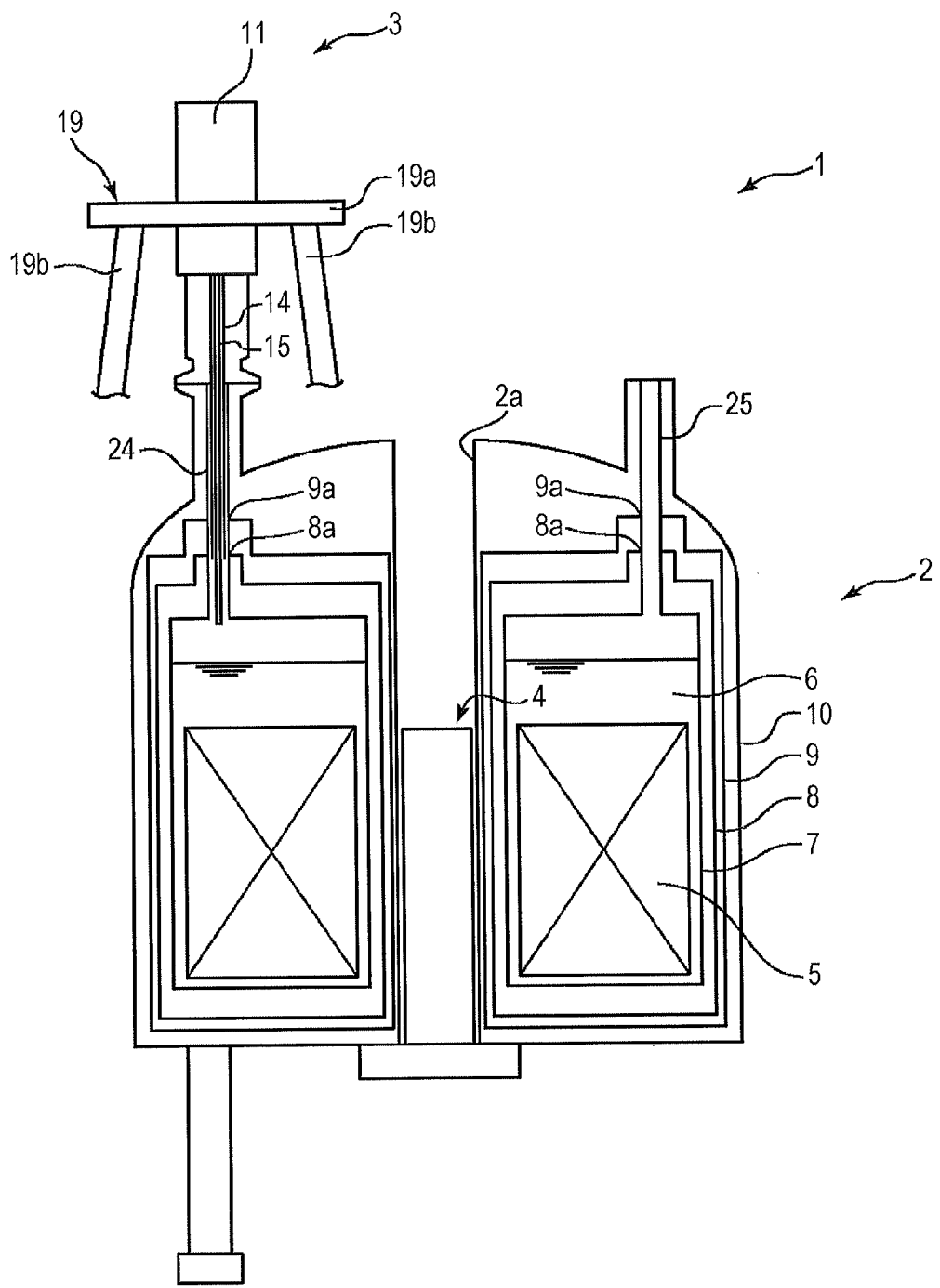
FIG. 1 is a front sectional view schematically illustrating an overall structure of an NMR analysis device according to an embodiment of the present invention.

FIG. 1 is a front sectional view schematically illustrating an overall structure of an NMR analysis device according to an embodiment of the present invention.

Referring to FIG. 1, an NMR analysis device 1 analyzes a specimen (not shown) positioned in a static magnetic field produced by a superconducting magnet. Specifically, the NMR analysis device 1 includes a magnetic field producing unit 2, a re-condensation device 3, and a magnetic field correction unit 4. The magnetic field producing unit 2 produces a static magnetic field in a through hole 2a. The re-condensation device 3 is provided in the static magnetic field producing unit 2 so as to re-condense a gasified refrigerant in the static magnetic field producing unit 2. The magnetic field correction unit 4 corrects the degree of uniformity of the magnetic field in the through hole 2a. The NMR analysis device 1 analyzes the specimen positioned in the magnetic field correction unit 4.

The magnetic field producing unit 2 includes an annular superconducting magnet 5, a liquid helium tank 7, a pair of neck tubes 24 and 25, a vacuum container 10, a heat shield 8 (second covering member) and a heat shield 9 (first covering member). The liquid helium tank 7 contains the superconducting magnet 5 and liquid helium 6 that cools the superconducting magnet 5. The neck tubes 24 and 25 protrude upward from the liquid helium tank 7. The vacuum container 10 has a vacuum chamber formed therein that contains the liquid helium tank 7 and the neck tubes 24 and 25. The heat shields 8 and 9 are disposed between the liquid helium tank 7 and the vacuum container 10 so as to enclose the liquid helium tank 7, thereby suppressing penetration of external heat into the liquid helium tank 7.

The liquid helium tank 7 is formed of stainless steel and contains the superconducting magnet 5 and the liquid helium 6. Specifically, the liquid helium tank 7 has an annular shape corresponding to the shape of the superconducting magnet 5.

An upper end portion of each of the neck tubes 24 and 25 penetrates through the vacuum container 10 and is open at the top. The re-condensation device 3 is detachably attached to the neck tube 24. In the present embodiment, a lid body (not shown) is attached to the neck tube 25. The lid body closes an opening formed in an upper portion of the neck tube 25. The re-condensation device 3 may also be attached to the neck tube 25 so as to improve efficiency of re-condensation of liquid helium.

The heat shield 8 covers an area around the liquid helium tank 7 with the neck tubes 24 and 25 inserted therethrough. Specifically, the heat shield 8 has an annular shape corresponding to the shape of the liquid helium tank 7. The heat shield 8 has a pair of outside contact parts 8a, which are respectively in thermal contact with outer peripheral surfaces of the neck tubes 24 and 25 throughout the respective peripheries of the neck tubes 24 and 25.

The heat shield 9 covers an area around the heat shield 8 with the neck tubes 24 and 25 inserted therethrough so as to suppress penetration of external heat into the heat shield 8. Specifically, the heat shield 9 has an annular shape corresponding to the shape of the heat shield 8. The heat shield 9 has a pair of outside contact parts 9a, which are respectively in thermal contact with outer peripheral surfaces of the neck tubes 24 and 25 throughout the respective peripheries of the neck tubes 24 and 25.

Figure 2:
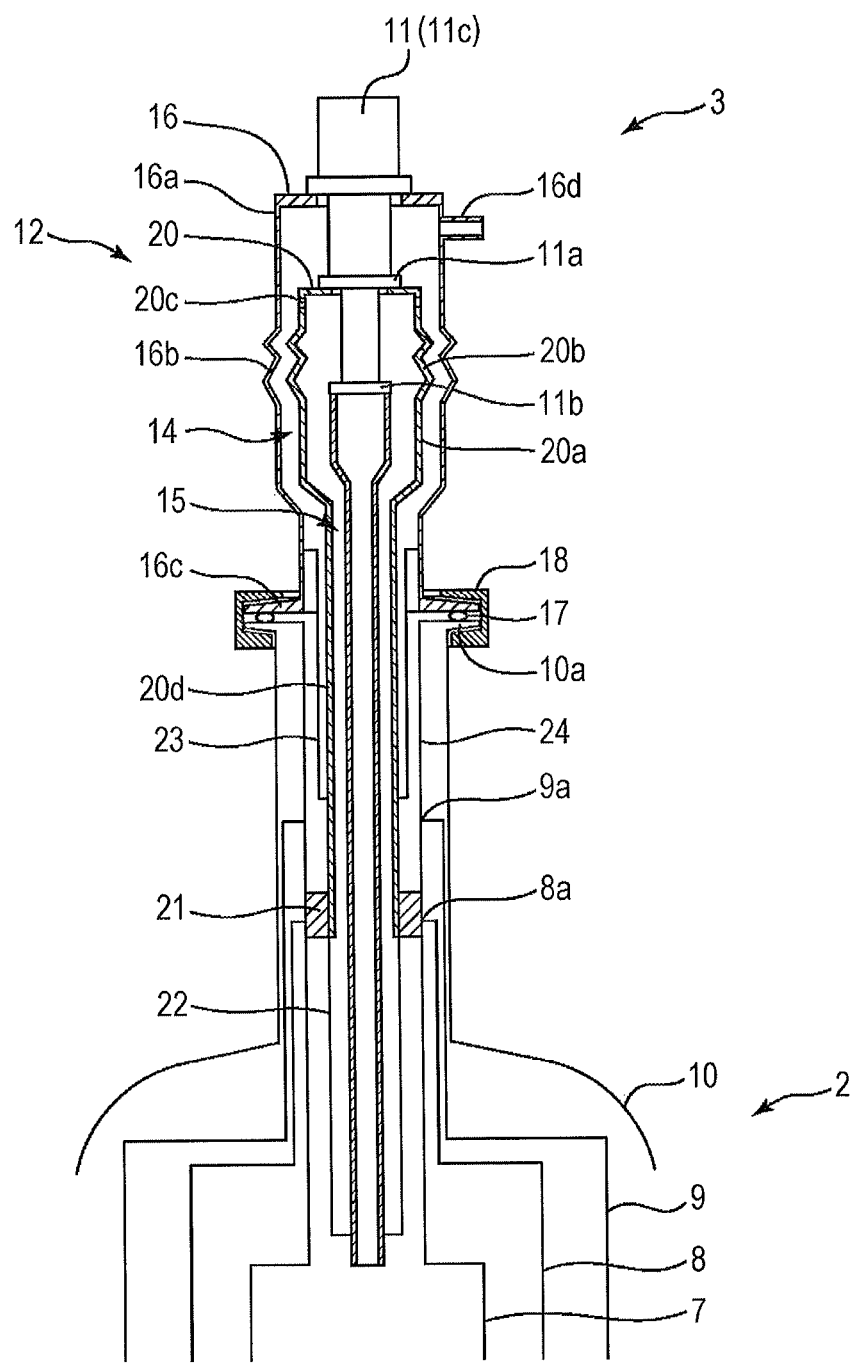
FIG. 2 is an enlarged front view of a re-condensation device illustrated in FIG. 1.
Figure 3:
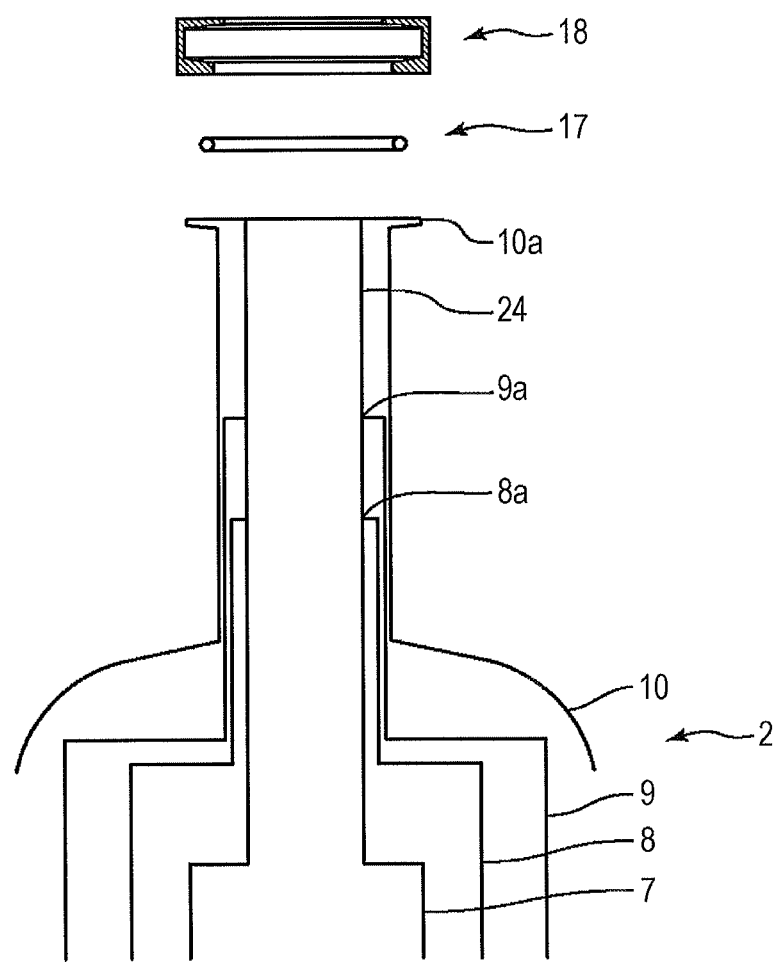
FIG. 3 is a front view of a structure illustrated in FIG. 2 with the re-condensation device removed.
Figure 4:
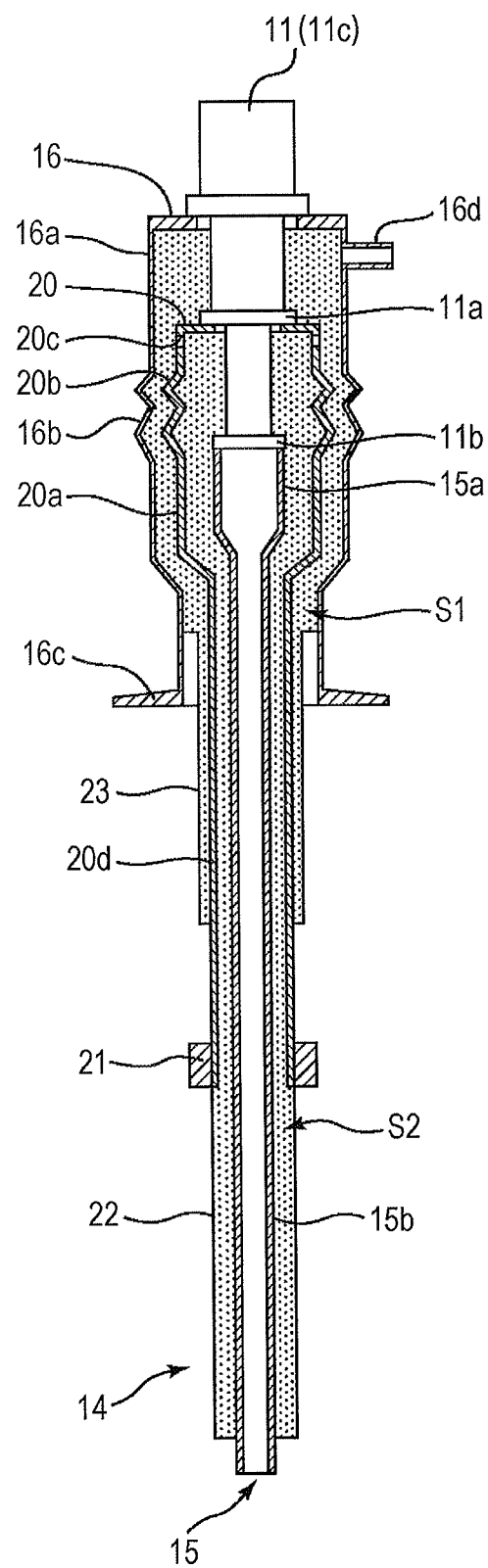
FIG. 4 is a front view illustrating only the re-condensation device illustrated in FIG. 2.

FIG. 2 is an enlarged front view of the re-condensation device 3 illustrated in FIG. 1. FIG. 3 is a front view of a structure illustrated in FIG. 2 with the re-condensation device 3 removed. FIG. 4 is a front view illustrating only the re-condensation device 3 illustrated in FIG. 2.

Referring to FIGS. 1 to 4, the re-condensation device 3 re-condenses helium gas, which has been gasified in the liquid helium tank 7 and is moved upward in the neck tube 24, and cools the heat shields 8 and 9. Specifically, the re-condensation device 3 includes a chiller 11, an attachment member 12, a first cooling member 14, and a second cooling member 15. The attachment member 12 is used to attach the chiller 11 to the magnetic field producing unit 2. The first cooling member 14 is thermally connected to a first cooling stage 11a of the chiller 11, and the second cooling member 15 is thermally connected to a second cooling stage 11b of the chiller 11.

The chiller 11 is a two-stage cryogenic chiller. Specifically, the chiller 11 includes a chiller main body 11c, the first cooling stage 11a and the second cooling stage 11b. The first cooling stage 11a is provided in the chiller main body 11c and cooled to a temperature of 30 K to 60 K (−243° C. to −213° C.). The second cooling stage 11b is provided in the chiller main body 11c at a position closer to a tip end side of the chiller main body 11c than the first cooling stage 11a and cooled to a temperature of 4.2 K (−269° C.).

The attachment member 12 is used to attach the chiller 11 to the neck tube 24. Specifically, the attachment member 12 includes an attachment member main body 16, an O-ring 17, a securing member 18, a support table 19 (see FIG. 1), and a first connecting part 23. The attachment member main body 16 extends from the chiller 11 toward the tip end side (lower side in the drawings). The O-ring is provided between a lower surface of the attachment member main body 16 and an upper surface of the neck tube 24. The securing member 18 is used to secure the attachment member main body 16 to the neck tube 24. The support table 19 supports the attachment member main body 16. The first connecting part 23 is used to connect the attachment member main body 16 to the first cooling member 14. The first connecting part 23 forms a first chamber S1 (see FIG. 4) between the first cooling member 14 and the attachment member main body 16. That is, in the present embodiment, the attachment member main body 16 together with the first connecting part 23 is an example of a chamber forming member that forms the first chamber S1 outside the first cooling member 14.

The attachment member main body 16 covers a portion of the first cooling member 14 from the outside of the first cooling member 14, the portion being disposed outside the neck tube 24. The first cooling member 14 will be described later. Specifically, the attachment member main body 16 has a cylindrical part 16a, a vibration absorbing part 16b, a flange 16c, and a discharge port 16d. The cylindrical part 16a is secured to the chiller main body 11c at a position closer to a base end side (upper side in the drawings) of the chiller main body 11c than the first cooling stage 11a and extends toward the tip end side. The vibration absorbing part 16b is formed in an intermediate portion of the cylindrical part 16a. The flange 16c is formed in a tip end portion (lower end portion) of the cylindrical part 16a. The discharge port 16d allows gas in the cylindrical part 16a to be discharged therethrough. The vibration absorbing part 16b is formed by processing a portion of the cylindrical part 16a into a bellows-like shape. The vibration absorbing part 16b is elastically deformed (extends and contracts) so as to suppress transference of vibration generated in the chiller 11 to the magnetic field producing unit 2 (neck tube 24). The O-ring 17 is sandwiched between the flange 16c of the attachment member main body 16 and an edge of an opening of the neck tube 24 so as to suppress helium gas to flow out through a gap between the attachment member main body 16 and the neck tube 24. The securing member 18 restrains the movement in the up-down direction of the attachment member main body 16 and the neck tube 24, between which the O-ring 17 is sandwiched.

The support table 19 supports the chiller 11 itself in addition to support provided by the magnetic field producing unit 2. Specifically, as illustrated in FIG. 1, the support table 19 includes a securing plate 19a and four legs 19b. The securing plate 19a is secured to the chiller 11, and the legs 19b support the securing plate 19a. When the chiller 11 itself is supported by the support table 19 as described above, compared to a case where the chiller 11 is directly supported by the magnetic field producing unit 2, transference of vibration from the chiller 11 to the magnetic field producing unit 2 (neck tube 24) can be suppressed.

A portion of the first cooling member 14 is inserted into the neck tube 24 so as to cool the heat shield 8. Specifically, the first cooling member 14 has a cylindrical first main body part 20, an inside contact part 21, and a second connecting part 22. The first main body part 20 is thermally connected to the first cooling stage 11a of the chiller 11. The inside contact part 21 is formed in the first main body part 20. The second connecting part 22 connects a tip end portion of the first main body part 20 to the second cooling member 15, which will be described later. The second connecting part 22 and the second cooling member 15 form a second chamber S2 (see FIG. 4) therebetween. The second connecting part 22 and the second cooling member 15 will be described later.

The first main body part 20 is formed of aluminum and extends from the chiller 11 toward the tip end side (lower side in the drawings) inside the attachment member main body 16. The first main body part 20 has a base part 20a and a first insertion part 20d. The base part 20a is connected to the first cooling stage 11a of the chiller 11. The first insertion part 20d extends from the base part 20a toward the tip end side and is inserted into the neck tube 24. A vibration absorbing part 20b is formed by processing an intermediate portion of the base part 20a into a bellows-like shape. The vibration absorbing part 20b is elastically deformed (extends and contracts) so as to suppress transference of vibration generated in the chiller 11 to the magnetic field producing unit 2 (neck tube 24). The first insertion part 20d has a diameter smaller than that of the base part 20a and the first cooling stage 11a so as to be insertable into the neck tube 24. The cylindrical first connecting part 23 is provided between an outer surface of the first insertion part 20d and an inner surface of the cylindrical part 16a of the attachment member main body 16. Using the first connecting part 23, the first chamber S1 is formed between the first main body part 20 and the cylindrical part 16a. The first chamber S1 communicates with the discharge port 16d. Accordingly, the first chamber S1 also communicates with a space inside the first main body part 20 through a communication hole 20c formed in the base part 20a.

Figure 8:
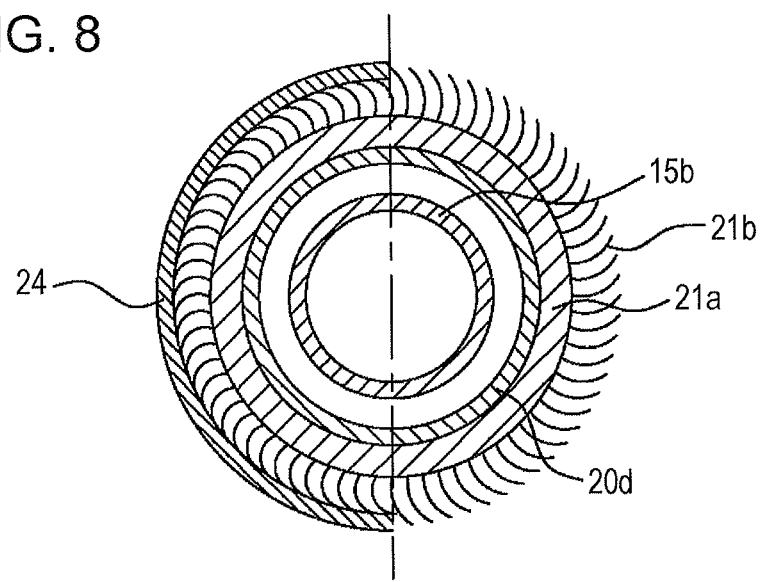
FIG. 8 is a sectional plan view of the inside contact part illustrated in FIG. 2.

FIG. 8 is a sectional plan view of the inside contact part 21 illustrated in FIG. 2.

Figure 9:
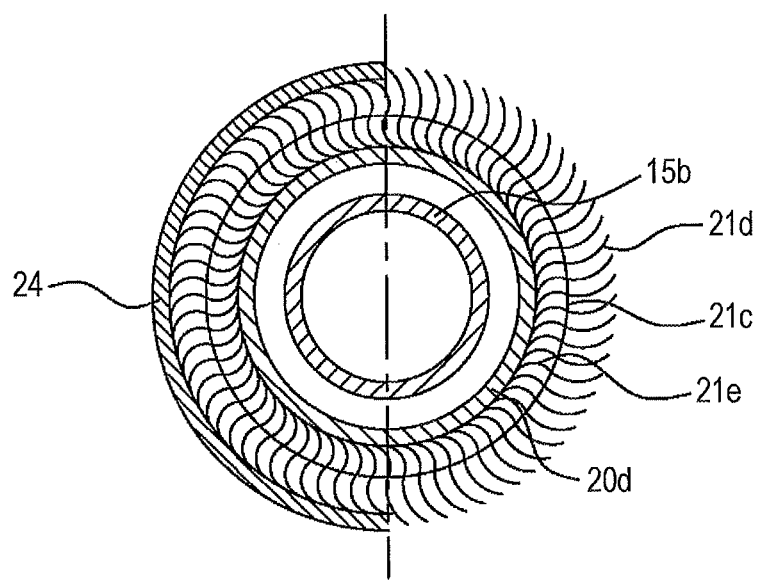
FIG. 9 is a sectional plan view of a modification of the inside contact part illustrated in FIG. 2.

Referring to FIGS. 2 and 8, the inside contact part 21 thermally connects the first insertion part 20d of the first main body part 20 to the neck tube 24. Specifically, the inside contact part 21 is formed of a material having a good thermal conductivity (for example, BeCu, phosphor bronze, or the like). The inside contact part 21 has a contact part main body 21a and a number of contact fins 21b. The contact part main body 21a is secured to the outer side surface of the first insertion part 20d. The contact fins 21b protrude from an outer surface of the contact part main body 21a. Each contact fin 21b elastically deforms due to contact with an inner side surface of the neck tube 24, thereby effectively ensuring the area thereof in contact with the inner side surface of the neck tube 24. Although FIG. 8 illustrates the inside contact part 21 having the contact fins 21b formed only on an outer side of the contact part main body 21a, this does not limit the structure of the inside contact part 21. For example, as illustrated in FIG. 9, the inside contact part 21 may have contact fins on inner and outer sides. Specifically, the inside contact part 21 illustrated in FIG. 9 has a contact part main body 21c, a number of outer fins 21d, and a number of inner fins 21e. The outer fins 21d protrude from an outer side surface of the contact part main body 21c and the inner fins 21e protrude from an inner side surface of the contact part main body 21c. Each inner fin 21e elastically deforms when the contact part main body 21c is fitted onto an outer side of the first insertion part 20d, thereby effectively ensuring the area thereof in contact with the outer side surface of the first insertion part 20d. Each outer fin 21d elastically deforms through contact with the inner side surface of the neck tube 24, thereby effectively ensuring the area thereof in contact with the inner side surface of the neck tube 24. The contact fins 21b, the outer fins 21d, and the inner fins 21e are examples of the vibration absorbing part of the present embodiment. That is, the fins 21b, 21d, and 21e have an elastic modulus sufficient to allow vibration transferred from the chiller 11 to be absorbed.

As illustrated in FIG. 2, the inside contact part 21 is disposed so as to contact a portion of the neck tube 24 from the inside of the neck tube 24, the portion being in contact with the outside contact part 8a of the heat shield 8. Accordingly, the cold from the inside contact part 21, which is thermally connected to the first cooling stage 11a of the chiller 11, is transferred to the heat shield 8 through the neck tube 24. Thus, the heat shield 8 is cooled to a temperature corresponding to the temperature of the first cooling stage 11a of the chiller 11. For this reason, penetration of external heat into the liquid helium tank 7, which is covered by the heat shield 8, is suppressed.

Referring to FIGS. 2 and 4, a portion of the second cooling member 15 is inserted into the neck tube 24 so as to re-condense helium gas in the neck tube 24. Specifically, the cylindrical second cooling member 15 is formed of aluminum and extends from the chiller 11 toward the tip end side (lower side in the drawings) inside the first main body part 20 of the first cooling member 14. The second cooling member 15 has a cylindrical base part 15a and a second insertion part 15b. The base part 15a is thermally connected to the second cooling stage 11b of the chiller 11. The second insertion part 15b extends from the base part 15a toward the tip end side and is inserted into the neck tube 24. The second insertion part 15b has a diameter smaller than that of the base part 15a so as to be insertable into the neck tube 24.

The cylindrical second connecting part 22 is provided between an outer surface of the second insertion part 15b and a tip end portion of the first insertion part 20d. Using the second connecting part 22, the second chamber S2 is formed between the first main body part 20 and the second cooling member 15. The second chamber S2 communicates with the first chamber S1 formed between the first main body part 20 and the cylindrical part 16a through the communication hole 20c formed in the first main body part 20. Accordingly, by discharging gas in the cylindrical part 16a through the discharge port 16d, negative pressure can be developed in the chambers represented as dotted areas in FIG. 4. Thus, penetration of external heat into the first cooling member 14 can be suppressed, and penetration of external heat into the second cooling member 15, which is positioned inside the first cooling member 14, can also be suppressed. In particular in the present embodiment, the chamber S1 is also formed in a portion positioned outside (upper side of) the neck tube 24 and exposed to a room-temperature environment. Thus, by suppressing penetration of heat into this portion, re-condensation of liquid helium and cooling of the heat shield 8 can be effectively performed. When negative pressure is developed in the first chamber S1, heat penetration into the first main body part 20 can be more effectively suppressed by inserting a heat insulating member (for example, Super Insulation) into the first chamber S1.

Figure 5:
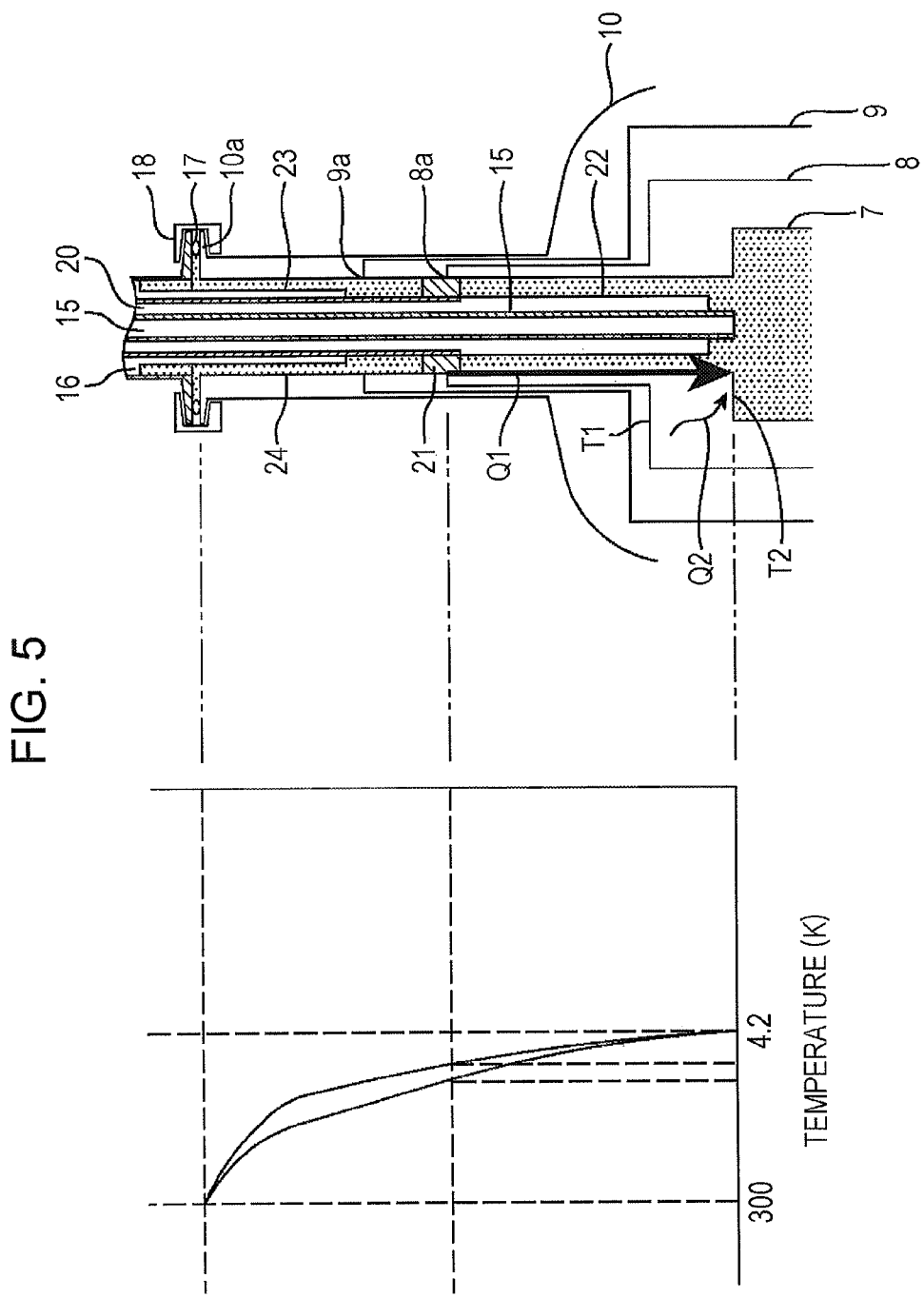
FIG. 5 is a schematic diagram illustrating the relationship between the position in height from a liquid helium tank to a tip end portion of a neck tube and the temperature.

Action of suppressing penetration of heat performed by the NMR analysis device 1 is described below with reference to FIGS. 5 and 6. FIG. 5 is a schematic diagram illustrating the relationship between the position in height from the liquid helium tank 7 to a tip end portion of the neck tube 24 and the temperature. FIG. 6 is a table that shows temperatures of portions of the NMR analysis device 1 of the present embodiment having the inside contact part 21 and temperatures of portions of an NMR analysis device 1 of a comparative example without an inside contact part.

Referring to FIGS. 5 and 6, the temperature at a portion of the neck tube 24, the portion being in contact with the outside contact part 8a, is lower in the structure of the present embodiment than that of the comparative example. Furthermore, temperature T1 of the heat shield 8 is also lower in the structure of the present embodiment than that of the comparative example. Temperature T2 of the liquid helium tank 7 of the structure of the present embodiment is about 4.2 K, which is equal to that of the comparative example.

This results in the following.

External heat penetration into the liquid helium tank 7 is, as illustrated in FIG. 5, generally classified into heat conduction Q1 and radiant heat transfer Q2 as follows: in the heat conduction Q1, heat is conducted to the liquid helium tank 7 from the outside contact parts 8a through structural members including the neck tube 24; in the radiant heat transfer Q2, heat is transferred to the liquid helium tank 7 from the heat shield 8. Here, the heat conduction Q1 increases as the difference in temperature between the outside contact parts 8a and the liquid helium tank 7 increases. Likewise, the heat conduction Q2 increases as the difference in temperature between the heat shield 8 and the liquid helium tank 7 increases. Thus, external heat penetration into the liquid helium tank 7 is larger in the comparative example than in the structure of the present embodiment.

As described above, in the NMR analysis device 1 of the present embodiment, compared to the comparative example without the inside contact part, penetration of external heat into the liquid helium tank 7 can be effectively suppressed.

As described above, in the NMR analysis device 1 of the present embodiment, by causing the inside contact part 21, which is thermally connected to the first cooling stage 11a of the chiller 11, to contact with the inside of the neck tube 24, the neck tube 24 can be cooled and, in addition, the heat shield 8 can be cooled through the neck tube 24. Thus, in the NMR analysis device 1, by cooling the neck tube 24 and the heat shield 8 as described above, penetration of external heat into the liquid helium tank 7 (heat conduction Q1 and radiant heat transfer Q2) can be suppressed. Accordingly, the overall size of the device can be reduced by omitting a liquid nitrogen tank, which is provided in the related art, while penetration of heat into the liquid helium tank 7 can be suppressed.

Furthermore, in the NMR analysis device 1, the chiller 11 itself is not inserted into the neck tube 24. Instead, the first insertion part 20d of the first cooling member 14, which is thermally connected to the chiller 11, is inserted into the neck tube 24. Accordingly, by forming the first cooling member 14 so as to have the thickness corresponding to that of the neck tube 24, the re-condensation device 3 that is attachable to an existing neck tube 24 without changing the thickness of the neck tube 24 can be provided. Thus, the above-described re-condensation device 3 is applicable to an existing neck tube 24 without increasing the inner diameter of the neck tube 24. For this reason, the heat shield 8 can be cooled without increasing the area of the neck tube 24, which is subjected to penetration of external heat.

Furthermore, the NMR analysis device 1 is provided with the heat shield 9 outside the heat shield 8, which is cooled by the chiller 11. Thus, penetration of external heat into the heat shield 8 can also be suppressed by the heat shield 9.

In the above-described embodiment, the second cooling member 15 is inserted into the neck tube 24 through the inside of the first cooling member 14. Accordingly, both the first cooling member 14 and the second cooling member 15 can be inserted into an existing neck tube 24 without increasing the inner diameter of the neck tube 24. Furthermore, in the above-described embodiment, the second cooling member 15 is disposed inside the first cooling member 14. Thus, penetration of external heat into the second cooling member 15 can be suppressed using the first cooling member 14, thereby allowing reduction in efficiency of re-condensation due to the penetration of heat to be suppressed.

In the above-described embodiment, negative pressure is developed in the first chamber S1, which is formed in a space defined by the first connecting part 23, the attachment member main body 16 (the example of the chamber forming member together with the first connecting part 23), and the first cooling member 14. The attachment member main body 16 and the first connecting part 23 cover a portion of the first main body part 20 disposed outside the neck tube 24. This suppresses heat transfer through a gas in the first chamber S1. Thus, penetration of external heat into a portion of the first cooling member 14, the portion being covered with the attachment member main body 16 and the first connecting part 23, can be suppressed. In particular, the attachment member main body 16 and the first connecting part 23 cover a portion of the first cooling member 14, the portion being disposed outside the neck tube 24. Thus, penetration of external heat (that is, heat from a room-temperature environment) into a portion of the first cooling member 14 disposed outside the neck tube 24 can be effectively suppressed.

In the above-described embodiment, negative pressure is developed in the second chamber S2 (see FIG. 4), which is formed between the first cooling member 14 and the second cooling member 15. This causes heat transfer through a gas in the second chamber S2 to be suppressed, and accordingly, penetration of heat into the second cooling member 15 can be effectively suppressed using both the first cooling member 14 and the second chamber S2.

In the above-described embodiment, the discharge port 16d is formed in the attachment member main body 16, and the communication hole 20c is formed in the first main body part 20. With this structure, the first chamber S1 and the second chamber S2 communicate with each other through the communication hole 20c. Thus, by discharging a gas in the first chamber S1 through the discharge port 16d, negative pressure can be developed in the chambers S1 and S2.

In the above-described embodiment, the vibration absorbing part 20b is formed in the first main body part 20. Also in the above-described embodiment, the inside contact part 21 has elastically deformable contact fins 21b, or 21d and 21e. According to the embodiment, transference of vibration generated in the chiller 11 to the neck tube 24 through the inside contact part 21 can be suppressed using the vibration absorbing part 20b or the contact fins 21b, or 21d and 21e. Thus, effects caused by vibration on the static magnetic field produced by the superconducting magnet 5 can be suppressed, and accordingly, a decrease in analytical precision can be suppressed.

In the above-described embodiment, as illustrated in FIG. 4, the first chamber S1 is formed by the first connecting part 23, which connects the attachment member main body 16 to the first cooling member 14, between the first cooling member 14 and the attachment member main body 16. However, the first chamber S1 is not limited to this. The first connecting part 23 can be omitted as illustrated in FIG. 7.

Figure 7:
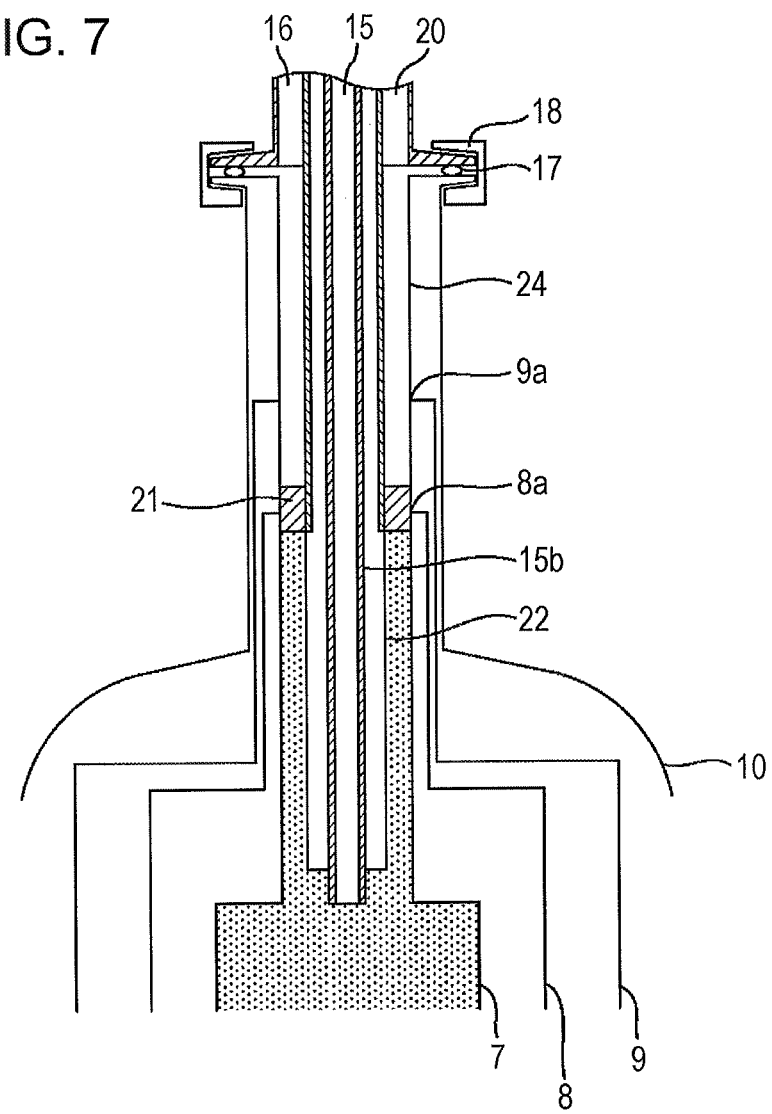
FIG. 7 is an enlarged front sectional view of part of a modification of the NMR analysis device illustrated in FIG. 1.

Specifically, in a structure illustrated in FIG. 7, the inside contact part 21 uses a sealing member that blocks a flow of a gas between the neck tube 24 and the first insertion part 20d. With this inside contact part 21, a space above the inside contact part 21 can be used as the first chamber S1, thereby allowing the first connecting part 23 to be omitted.

Although the above-described inside contact part 21 having a sealing property may use a known sealing material, the inside contact part 21 is not limited to this. In order to ensure higher thermal conductivity, the following structure may be used. For example, a material having a comparatively low melting point (for example, gallium, the melting point of which is 32° C.) in the solid state is disposed between the neck tube 24 and the first main body part 20. The material is fused and cured. This can block a flow of a gas between the neck tube 24 and the first main body part 20. The above-described material may be indium (melting point is 156° C.). Alternatively, the material in the solid state may be disposed between the fins 21b, or between the fins 21d and between the fins 21e of the inside contact part 21 illustrated in FIG. 8 or 9, fused, and then cured.

Although the neck tubes 24 and 25 are formed of stainless steel in the above-described embodiment, this does not limit the material of the neck tubes 24 and 25. For example, portions of the neck tubes 24 and 25, the portions being in contact with the outside contact parts 8a of the heat shields 8, may instead be formed of a material having a higher thermal conductivity (for example, copper).

Although the second cooling member 15 is formed of a single cylindrical member in the above-described embodiment, this does not limit the structure of the second cooling member. For example, the second cooling member may be formed of two cylinders, one of which is disposed inside the other. By doing this, helium gas flows in a single direction in the inner cylinder and helium gas flows in a single direction in a space between the inner and outer cylinders, thereby improving efficiency in transferring heat in the second cooling member.

Although a portion of the neck tube 24 in contact with the outside contact part 8a of the heat shield 8 is in contact with the inside contact part 21 from the inside of the neck tube 24 in the above-described embodiment, a manner in which the inside contact part 21 is in contact with the neck tube 24 is not limited to this. For example, the inside contact part 21 may be in contact with the neck tube 24 from the inside of the neck tube 24 between a high-temperature end part (upper end portion in FIG. 2) of the outside contact part 9a of the heat shield 9 and a low-temperature end part (lower end portion in FIG. 2) of the outside contact parts 8a of the heat shield 8. By doing this, penetration of heat into the liquid helium tank 7 can be suppressed by cooling at least one of the heat shields 8 and 9.

The inside contact part 21 may cool both the outside contact parts 8a and 9a of the heat shields 8 and 9.

The aforementioned embodiment mainly includes an invention having structures as described below.

In order to solve the above-described problem, the present invention provides a re-condensation device provided in a magnetic field producing unit that includes a liquid helium tank that contains a superconducting magnet and liquid helium that cools the superconducting magnet, a neck tube that protrudes upward from the liquid helium tank, and at least one covering member that covers the liquid helium tank from an outside of the liquid helium tank and that has an outside contact part that is in thermal contact with the neck tube from an outside of the neck tube. The re-condensation device re-condenses the liquid helium and includes a chiller that includes a first cooling stage and a second cooling stage, the temperature of which is decreased to a temperature lower than a temperature of the first cooling stage, and a second cooling member thermally connected to the second cooling stage. At least a portion of the second cooling member is inserted into the neck tube so as to re-condense the liquid helium. The re-condensation device also includes a first cooling member that is thermally connected to the first cooling stage. At least a portion of the first cooling member is inserted into the neck tube. In the re-condensation device, the first cooling member has a first insertion part having a diameter, with which the first insertion part is able to be inserted into the neck tube, and an inside contact part provided on an outer side surface of the first insertion part so as to cool the covering member through contact with a portion of the neck tube from an inside of the neck tube.

According to the present invention, through contact of the inside contact part, which is thermally connected to the first cooling stage of the chiller, with the inside of the neck tube, the covering member can be cooled through the neck tube. Thus, according to the present invention, the covering member that covers the liquid helium tank from the outside of the liquid helium tank is cooled as described above. This can suppress penetration of external heat into the liquid helium tank. Accordingly, the overall size of the device can be reduced by omitting the liquid nitrogen tank, which is provided in the related art, while penetration of heat into the liquid helium tank can be suppressed.

Furthermore, according to the present invention, the chiller itself is not inserted into the neck tube. Instead, the first cooling member, which is thermally connected to the chiller, is inserted into the neck tube. Accordingly, by forming the first cooling member so as to have the thickness corresponding to that of the neck tube, the re-condensation device that is attachable to an existing neck tube without changing the thickness of the neck tube can be provided. Thus, according to the present invention, the re-condensation device is applicable to an existing neck tube without increasing the inner diameter of the neck tube. For this reason, the covering member can be cooled without increasing the area of the neck tube, which is subjected to penetration of external heat.

In the above-described re-condensation device, it is preferable that the first cooling member be formed to have a cylindrical shape and the second cooling member have a diameter, with which the second cooling member is able to pass through inside the first cooling member and to be inserted into the neck tube.

In this form of implementation, the second cooling member is also inserted into the neck tube through the inside of the first cooling member. Accordingly, both the first cooling member and the second cooling member can be inserted into an existing neck tube without increasing the inner diameter of the neck tube. Furthermore, in the above-described form of implementation, the second cooling member is disposed inside the first cooling member. Thus, penetration of external heat into the second cooling member can be suppressed using the first cooling member, thereby allowing reduction in efficiency of re-condensation due to the heat penetration to be suppressed.

It is preferable that the above-described re-condensation device further include a chamber forming member that covers a portion of the first cooling member from an outside of the first cooling member, the portion being disposed outside the neck tube, so as to form a first chamber between the chamber forming member and the first cooling member, and a negative pressure be developed in the first chamber.

In this form of implementation, since a negative pressure is developed in the first chamber, heat transfer through a gas in the first chamber is suppressed. Thus, penetration of external heat into a portion of the first cooling member, the portion being covered with the chamber forming member, can be suppressed. In particular, the chamber forming member covers a portion of the first cooling member, the portion being disposed outside the neck tube. Thus, penetration of external heat (that is, heat from a room-temperature environment) into a portion of the first cooling member disposed outside the neck tube can be effectively suppressed. Here, when a negative pressure is developed in the first chamber, heat penetration into the first cooling member can be more effectively suppressed by inserting a heat insulating member (for example, Super Insulation) into the first chamber.

In the above-described re-condensation device, it is preferable that a second chamber, which is separated from an area outside the first cooling member, be formed between the first cooling member and the second cooling member, and a negative pressure be developed in the second chamber.

In this form of implementation, a negative pressure is developed in the second chamber formed between the first cooling member and the second cooling member. This causes heat transfer through a gas to be suppressed also in the second chamber, and accordingly, penetration of heat into the second cooling member can be effectively suppressed using both the first cooling member and the second chamber.

In the above-described re-condensation device, it is preferable that the chamber forming member have a discharge port that allows gas in the first chamber to be discharged through the discharge port, and the first cooling member have a communication hole that allows the first chamber and the second chamber to communicate with each other.

In this form of implementation, the first chamber and the second chamber communicate with each other through the communication hole. Accordingly, by discharging gas in the first chamber through the discharge port, negative pressure can be developed in the first chamber and the second chamber.

In the above-described re-condensation device, it is preferable that the first cooling member have a vibration absorbing part that absorbs vibration transferred from the chiller toward the inside contact part.

In this form of implementation, transference of vibration generated in the chiller to the neck tube through the inside contact part can be suppressed using the first cooling member that has the vibration absorbing part. Thus, effects caused by vibration on a static magnetic field produced by the superconducting magnet can be suppressed, and accordingly, a decrease in analytical precision can be suppressed.

The present invention provides an NMR analysis device that analyzes a specimen utilizing a static magnetic field produced by a superconducting magnet and includes a liquid helium tank that contains the superconducting magnet and liquid helium that cools the superconducting magnet, a neck tube that protrudes upward from the liquid helium tank, at least one covering member that covers the liquid helium tank from an outside of the liquid helium tank and that has an outside contact part that is in thermal contact with the neck tube from an outside of the neck tube, and the above-described re-condensation device that is provided in the neck tube and re-condenses the liquid helium. In the NMR analysis device, the first cooling member of the re-condensation device has the first insertion part having the diameter, with which the first insertion part is able to be inserted into the neck tube, and the inside contact part provided on the outer side surface of the first insertion part so as to cool the covering member through contact with a portion of the neck tube from an inside of the neck tube.

According to the present invention, through contact of the inside contact part, which is thermally connected to the first cooling stage of the chiller, with the inside of the neck tube, the covering member can be cooled through the neck tube. Thus, according to the present invention, the covering member that covers the liquid helium tank from the outside of the liquid helium tank is cooled as described above. This can suppress penetration of external heat into the liquid helium tank. Accordingly, the overall size of the device can be reduced by omitting the liquid nitrogen tank, which is provided in the related art, while penetration of heat into the liquid helium tank can be suppressed.

Furthermore, according to the present invention, the chiller itself is not inserted into the neck tube. Instead, the first cooling member, which is in thermal contact with the chiller, is inserted into the neck tube. Accordingly, by forming the first cooling member so as to have the thickness corresponding to that of the neck tube, the re-condensation device that is attachable to an existing neck tube without changing the thickness of the neck tube can be provided. Thus, according to the present invention, the re-condensation device is applicable to an existing neck tube without increasing the inner diameter of the neck tube. For this reason, the covering member can be cooled without increasing the area of the neck tube, which is subjected to penetration of external heat.

In the above-described NMR analysis device, it is preferable that the covering member include a second covering member that covers the liquid helium tank from an outside of the liquid helium tank and that has a second outside contact part that is in thermal contact with the neck tube from an outside of the neck tube. It is also preferable the covering member also include a first covering member that covers the second covering member from an outside of the second covering member and that has a first outside contact part that is in thermal contact with the neck tube. It is also preferable that the inside contact part be in contact with the neck tube at a position between a high-temperature end part of the first outside contact part and a low-temperature end part of the second outside contact part.

In this form of implementation, the inside contact part is in contact with the neck tube at a position between the high-temperature end part of the first outside contact part and the low-temperature end part of the second outside contact part. Thus, by cooling at least one of the first outside contact part and the second outside contact part through the neck tube, penetration of external heat into the liquid helium tank can be effectively suppressed as described above. Furthermore, in the above-described form of implementation, penetration of external heat into the second covering member can also be suppressed using the first covering member, which covers the second covering member. Thus, penetration of external heat into the liquid helium tank can be more effectively suppressed.

INDUSTRIAL APPLICABILITY

According to the present invention, the overall size of the NMR analysis device can be reduced and penetration of heat into the liquid helium tank can be suppressed.

REFERENCE SIGNS LIST

S1 first chamber
S2 second chamber
1 NMR analysis device
2 magnetic field producing unit
3 re-condensation device
5 superconducting magnet
7 liquid helium tank
8, 9 heat shield
8a, 9a outside contact part
11 chiller
11a first cooling stage
11b second cooling stage
14 first cooling member
15 second cooling member
16 attachment member main body (example of chamber forming member)
16d discharge port
20b vibration absorbing part
20c communication hole
20d first insertion part
21 inside contact part
23 first connecting part (example of chamber forming member)
23 second connecting part (example of chamber forming member)
24, 25 neck tube

The invention claimed is:

1. A re-condensation device provided in a magnetic field producing unit including a liquid helium tank that contains a superconducting magnet and liquid helium that cools the superconducting magnet, a neck tube that protrudes upward from the liquid helium tank, and at least one covering member that covers the liquid helium tank from an outside of the liquid helium tank and that has an outside contact part that is in thermal contact with the neck tube from an outside of the neck tube, the re-condensation device re-condensing the liquid helium, the re-condensation device comprising:
a chiller that includes a first cooling stage and a second cooling stage, a temperature of the second cooling stage being decreased to a temperature lower than a temperature of the first cooling stage;
a second cooling member that is thermally connected to the second cooling stage, at least a portion of the second cooling member being inserted into the neck tube so as to re-condense the liquid helium; and
a first cooling member that is thermally connected to the first cooling stage, at least a portion of the first cooling member being inserted into the neck tube,
wherein the first cooling member has a first insertion part having a diameter, with which the first insertion part is able to be inserted into the neck tube, and an inside contact part provided on an outer side surface of the first insertion part so as to cool the covering member through contact with a portion of the neck tube from an inside of the neck tube.

2. The re-condensation device according to claim 1,
wherein the first cooling member is formed to have a cylindrical shape and
the second cooling member has a diameter, with which the second cooling member is able to pass through inside the first cooling member and to be inserted into the neck tube.

3. The re-condensation device according to claim 2, further comprising:
a chamber forming member that covers a portion of the first cooling member from an outside of the first cooling member, the portion being disposed outside the neck tube, so as to form a first chamber between the chamber forming member and the first cooling member,
wherein a negative pressure is developed in the first chamber.

4. The re-condensation device according to claim 3,
wherein a second chamber is formed between the first cooling member and the second cooling member, the second chamber being separated from an area outside the first cooling member, and
wherein a negative pressure is developed in the second chamber.

5. The re-condensation device according to claim 4,
wherein the chamber forming member has a discharge port that allows gas in the first chamber to be discharged through the discharge port, and
wherein the first cooling member has a communication hole that allows the first chamber and the second chamber to communicate with each other.

6. The re-condensation device according to claim 1,
wherein the first cooling member has a vibration absorbing part that absorbs vibration transferred from the chiller toward the inside contact part.

7. An NMR analysis device that analyzes a specimen utilizing a static magnetic field produced by a superconducting magnet, the NMR analysis device comprising:
a liquid helium tank that contains the superconducting magnet and liquid helium that cools the superconducting magnet;
a neck tube that protrudes upward from the liquid helium tank;
at least one covering member that covers the liquid helium tank from an outside of the liquid helium tank and that has an outside contact part that is in thermal contact with the neck tube from an outside of the neck tube; and
the re-condensation device according to claim 1 that is provided in the neck tube and re-condenses the liquid helium,
wherein the first cooling member of the re-condensation device has the first insertion part having the diameter, with which the first insertion part is able to be inserted into the neck tube, and the inside contact part provided on the outer side surface of the first insertion part so as to cool the covering member through contact with a portion of the neck tube from an inside of the neck tube.

8. The NMR analysis device according to claim 7,
wherein the covering member includes
- a second covering member that covers the liquid helium tank from the outside of the liquid helium tank and that has a second outside contact part that is in thermal contact with the neck tube from the outside of the neck tube and a first covering member that covers the second covering member from an outside of the second covering member and that has a first outside contact part that is in thermal contact with the neck tube, and wherein the inside contact part is in contact with the neck tube at a position between a high-temperature end part of the first outside contact part and a low-temperature end part of the second outside contact part.

9. The re-condensation device according to claim 2,
wherein the first cooling member has a vibration absorbing part that absorbs vibration transferred from the chiller toward the inside contact part.

10. The re-condensation device according to claim 3,
wherein the first cooling member has a vibration absorbing part that absorbs vibration transferred from the chiller toward the inside contact part.

11. The re-condensation device according to claim 4,
wherein the first cooling member has a vibration absorbing part that absorbs vibration transferred from the chiller toward the inside contact part.

12. The re-condensation device according to claim 5,
wherein the first cooling member has a vibration absorbing part that absorbs vibration transferred from the chiller toward the inside contact part.

* * * * *